US011557101B2

(12) United States Patent
Veettil

(10) Patent No.: US 11,557,101 B2
(45) Date of Patent: Jan. 17, 2023

(54) ESTIMATION SYSTEM, SPACE DESIGN SUPPORT SYSTEM, ESTIMATION METHOD, AND PROGRAM

(71) Applicant: Panasonic Intellectual Property Management Co., Ltd., Osaka (JP)

(72) Inventor: Hareesh Puthiya Veettil, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 17/432,661

(22) PCT Filed: Jan. 9, 2020

(86) PCT No.: PCT/JP2020/000419
§ 371 (c)(1),
(2) Date: Aug. 20, 2021

(87) PCT Pub. No.: WO2020/174886
PCT Pub. Date: Sep. 3, 2020

(65) Prior Publication Data
US 2022/0165038 A1 May 26, 2022

(30) Foreign Application Priority Data
Feb. 25, 2019 (JP) .............................. JP2019-032066

(51) Int. Cl.
*G06T 19/00* (2011.01)
*G06T 15/00* (2011.01)
(52) U.S. Cl.
CPC .......... *G06T 19/006* (2013.01); *G06T 15/005* (2013.01)

(58) Field of Classification Search
None
See application file for complete search history.

(56) References Cited

U.S. PATENT DOCUMENTS

2016/0124405 A1 5/2016 Mandrusiak

FOREIGN PATENT DOCUMENTS

JP 2002-373181 A 12/2002
JP 2013-127654 A 6/2013

OTHER PUBLICATIONS

Ijima, Hideaki et al. "Dynamical Simulation Based on Piecewise Model of Passenger Compartment Temperature Considering External Environment, Passengers and Air Conditioning", Systems, Control and Information, Jan. 15, 2007, vol. 51, No. 1, pp. 10-20, ISSN 0916-1600, with partial English translation.
(Continued)

*Primary Examiner* — Robert J Craddock
(74) *Attorney, Agent, or Firm* — Renner, Otto, Boisselle & Sklar, LLP

(57) ABSTRACT

An estimation system includes a first acquisition unit, a second acquisition unit, and an estimation unit. The first acquisition unit acquires model information. The model information is information about a human model rendered in a virtual space. The human model is generated based on model data of a human. The second acquisition unit acquires environmental information. The environmental information is information about an environment corresponding to the virtual space and potentially having a particular effect on the human model. The estimation unit estimates a condition of the human model based on the model information and the environmental information.

13 Claims, 7 Drawing Sheets

(56) References Cited

OTHER PUBLICATIONS

International Search Report for corresponding Application No. PCT/JP2020/000419, dated Mar. 31, 2020.
Written Opinion for corresponding Application No. PCT/JP2020/000419, dated Mar. 31, 2020.
Extended European Search Report for corresponding Application No. 20763260.5, dated Mar. 2, 2022.

ESTIMATION SYSTEM, SPACE DESIGN SUPPORT SYSTEM, ESTIMATION METHOD, AND PROGRAM

TECHNICAL FIELD

The present disclosure generally relates to an estimation system, a space design support system, an estimation method, and a program. More particularly, the present disclosure relates to an estimation system for estimating the condition of a human model represented by a human's model data, a space design support system, an estimation method, and a program.

BACKGROUND ART

Patent Literature 1 discloses an article design support system for doing, in a virtual space, simulations of a digital human's movements when the digital human that is a human model rendered in the virtual space uses a virtual article model.

According to Patent Literature 1, with a type of the movement of the human model who is using the virtual article model specified, a load placed on a region of interest of the human model when the human model makes the specified type of movement is calculated. The load thus calculated is displayed on a monitor device.

CITATION LIST

Patent Literature

Patent Literature 1: JP 2013-127654 A

SUMMARY OF INVENTION

When estimation is made based on such a human model, the condition of a human (human body) should be approximated (or estimated) as closely as possible. In other words, the estimation accuracy of the human model's condition should be improved.

In view of the foregoing background, it is therefore an object of the present disclosure to provide an estimation system, a space design support system, an estimation method, and a program, all of which are configured or designed to contribute to improving the estimation accuracy of a human model's condition.

An estimation system according to an aspect of the present disclosure includes a first acquisition unit, a second acquisition unit, and an estimation unit. The first acquisition unit acquires model information. The model information is information about a human model rendered in a virtual space. The human model is generated based on model data of a human. The second acquisition unit acquires environmental information. The environmental information is information about an environment corresponding to the virtual space and potentially having a particular effect on the human model. The estimation unit estimates a condition of the human model based on the model information and the environmental information.

A space design support system according to another aspect of the present disclosure includes the estimation system described above and a display device. The presentation unit makes the display device display a presentation screen image indicating the condition estimated by the estimation unit and including the human model.

An estimation method according to still another aspect of the present disclosure includes a first acquisition step, a second acquisition step, and an estimation step. The first acquisition step includes acquiring model information. The model information is information about a human model rendered in a virtual space. The human model is generated based on model data of a human. The second acquisition step includes acquiring environmental information. The environmental information is information about an environment corresponding to the virtual space and potentially having a particular effect on the human model. The estimation step includes estimating a condition of the human model based on the model information and the environmental information.

A program according to yet another aspect of the present disclosure is designed to cause one or more processors to carry out the estimation method described above.

DESCRIPTION OF EMBODIMENTS

First Embodiment (1) Overview

Figure 1:
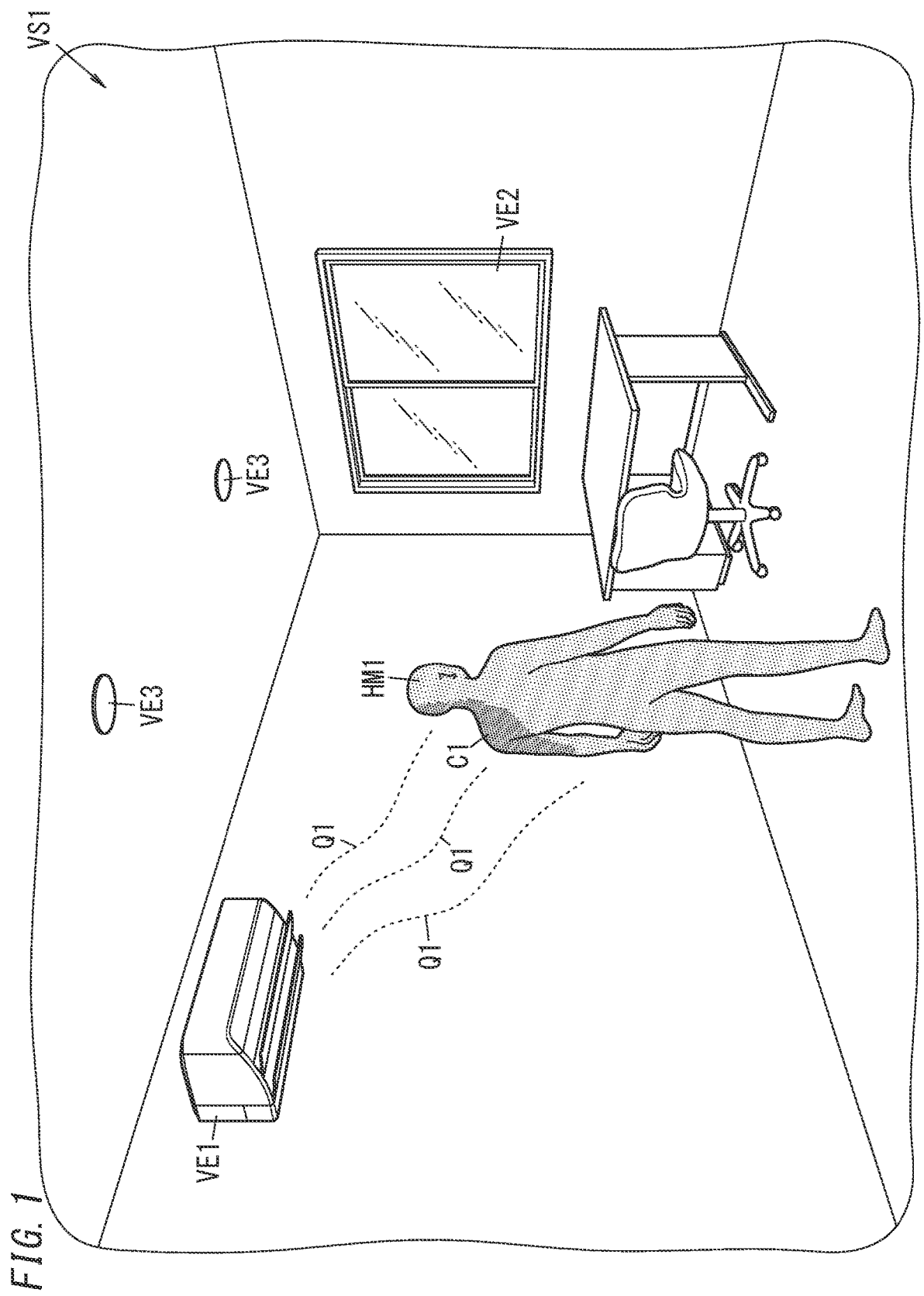
FIG. 1 is a conceptual diagram schematically depicting a virtual space for use in an estimation system according to a first embodiment.

An overview of an estimation system 1 according to an exemplary embodiment will be described with reference to FIGS. 1 and 2.

The estimation system 1 is a system for estimating the condition of a human model HM1. As used herein, the "human model" refers to a virtual model represented by data to be processed by one or more processors and simulating a human in a real space as shown in FIG. 1. The human model is rendered in a virtual space VS1. As used herein, the "virtual space" refers to a virtual space represented by data to be processed by one or more processors and reproduced on a computer system to simulate a real space. For example, the virtual space VS1 may be a space simulating the space inside an existent particular room. In other words, the virtual space VS1 does not exist in the real space (actual space) and is an insubstantial one. Likewise, the human model HM1 is a virtual model that is created as if the human model HM1 were actually present in such a virtual space VS1, and therefore, does not exist in the real space (actual space) and is an insubstantial one.

The result of estimation made by such an estimation system 1 may be used in, for example, designing, reforming, and evaluating facilities (including building), making marketing in the construction industry, and doing technical studies and developments. In other words, the result of estimation, obtained by estimating the condition of the human model HM1 rendered in the virtual space VS1, may be used in, for example, space design and equipment design of facilities. This facilitates the space design and equipment design of facilities. As used herein, "reforming" refers to not only repair of a facility which has deteriorated over time but also renovation to be made to add a new function to the facility and/or improve its handiness. For example, "reforming" as used herein includes, for example, replacement or addition of equipment, change of the floor plan, and remodeling.

Figure 2:
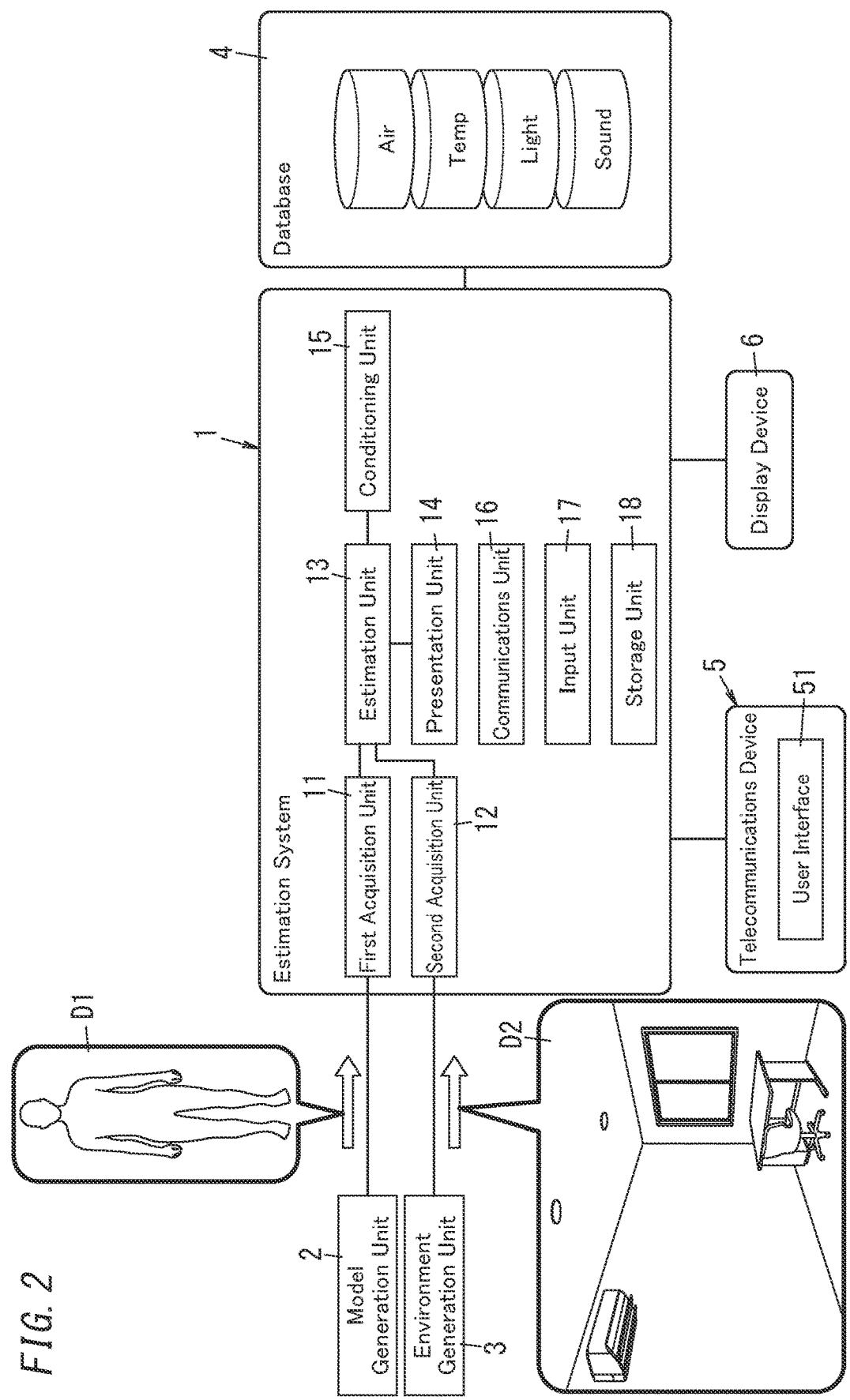
FIG. 2 is a block diagram illustrating a schematic configuration for the estimation system.

The estimation system 1 according to this embodiment includes a first acquisition unit 11, a second acquisition unit 12, and an estimation unit 13 as shown in FIG. 2. The first acquisition unit 11 acquires model information D1. The model information D1 is information about a human model HM1 rendered in the virtual space VS1. The human model HM1 is generated based on model data of a human. The second acquisition unit 12 acquires environmental information D2. The environmental information D2 is information about an environment corresponding to the virtual space VS1 and potentially having a particular effect on the human model HM1. The estimation unit 13 estimates the condition of the human model HM1 based on the model information D1 and the environmental information D2.

That is to say, in the estimation system 1 according to this embodiment, an environment corresponding to the virtual space VS1 and potentially having a particular effect on the human model HM1 may be taken into account when the condition of the human model HM1 is estimated. For example, in a real space (actual space), various environments such as temperature (heat) and lighting (light) have a particular effect on a human who is actually present in the real space. Consequently, the degree of comfort, for example, of the human varies according to the effect that the environment has on the human. Applying such an environment-based approach to the virtual space VS1 where the human model HM1 is rendered allows the estimation system 1 to estimate and approximate the condition of the human model HM1 more closely to the human in the real space. Therefore, this achieves the advantage of contributing to improving the estimation accuracy of the condition of the human model HM1.

(2) Details

Next, a configuration for the estimation system 1 according to this embodiment will be described in detail with reference to FIGS. 1 and 2.

(2.1) Premise

In the following description, the estimation result obtained by the estimation system 1 is supposed to be used in designing facilities (including buildings). Examples of "facilities" as used herein include non-residential facilities such as offices, factories, buildings, stores, schools, welfare facilities, and hospitals, and residential facilities such as single-family dwelling houses, multi-family dwelling houses, and respective dwelling units of multi-family dwelling houses. Such non-residential facilities also include theaters, movie theaters, public halls, amusement facilities, complex facilities, restaurants, department stores, hotels, inns, kindergartens, libraries, museums, art museums, underground shopping malls, railway stations, and airports. Furthermore, examples of the "facilities" as used herein further include not only buildings (constructions) but also other types of outdoor facilities such as ballparks, gardens, parking lots, playgrounds, and public parks.

In the embodiment to be described below, in particular, the result of estimation made by the estimation system 1 is supposed to be used in designing a room (an interior space) for use as an office, which is an exemplary one of those various facilities. Thus, in this embodiment, the estimation system 1 makes estimation about a human model HM1 rendered in a virtual space VS1 corresponding to a facility (e.g., an office in this example). In this case, the virtual space VS1 is a space simulating the internal space (interior space) of the facility (e.g., office in this example), i.e., a space virtually reproducing the facility.

Also, as used herein, the "condition" of the human model HM1 refers to a mental or physical condition of a "human" in the real space when the human model HM1 is replaced with the "human." As used herein, the "condition" includes comfort (including the degree of comfort and the degree of discomfort), loads (burdens) placed on respective parts of his or her body, and his or her condition of health. In this embodiment, the "comfort" is supposed to be an exemplary condition to be estimated for the human model HM1.

Furthermore, as used herein, the "environment" refers to a factor (thing) that may have a particular effect on a human that is actually present in the real space (actual space). For example, the "environment" includes one or more factors selected from temperature (heat), lighting (light), sound, odor, and air quality. The environment may include a combination of a plurality of factors such as temperature and lighting.

Furthermore, as used herein, the "particular effect" refers to a phenomenon that an environment such as the one described above brings about some physical change or gives some sensation or stimulus to the human that is actually present in the real space (actual space). For example, the environment such as temperature (heat) in the real space may have a particular effect on the human who is actually present in the real space by bringing about a change in the temperature of his or her skin or giving him or her a sense of hotness or coldness.

(2.2) Configuration

The estimation system 1 according to this embodiment includes the first acquisition unit 11, the second acquisition unit 12, and the estimation unit 13 as described above. In addition, in this embodiment, the estimation system 1 includes not only the first acquisition unit 11, the second acquisition unit 12, and the estimation unit 13 but also a presentation unit 14 and a conditioning unit 15 as well as shown in FIG. 2.

Furthermore, in this embodiment, the estimation system 1 is configured to be ready to communicate with each of a model generation unit 2, an environment generation unit 3, a database 4, a telecommunications device 5, and a display device 6. As used herein, "to be ready to communicate" means being able to transmit and receive a signal either directly or indirectly over a network or a repeater, for example, by an appropriate communication method such as wired communication or wireless communication. In other words, the estimation system 1 may transmit and receive signals to/from each of the model generation unit 2, the environment generation unit 3, the database 4, the telecommunications device 5, and the display device 6.

In this embodiment, the estimation system 1 may be implemented as, for example, a computer system (which may also be a server or a cloud computing system) including, as major constituent elements, one or more processors and one or more memories. The processor performs the function of the estimation system 1 by executing a program stored in the memory. The program may be stored in advance in the memory. Alternatively, the program may also be distributed after having been stored in a non-transitory storage medium such as a memory card or downloaded via a telecommunications line. In other words, the program described above is designed to make the one or more processors function as the estimation system 1.

The first acquisition unit 11 acquires the model information D1 as described above. The model information D1 is information about the human model HM1 rendered in the virtual space VS1 as described above. The human model HM1 is generated based on model data of a human. In this embodiment, the virtual space VS1 is a space that virtually reproduces the internal space (interior space) of an office as an exemplary facility. Thus, the human model HM1 is a model that virtually reproduces the "human" who is actually present in the internal space of the office as an exemplary facility.

The second acquisition unit 12 acquires the environmental information D2 as described above. The environmental information D2 is information about an environment corresponding to the virtual space VS1 and potentially having a particular effect on the human model HM1 as described above. In this embodiment, the environmental information D2 is information about an environment potentially having a particular effect on the human model HM1 in the virtual space VS1 that virtually reproduces the internal space (interior space) of the office as an exemplary facility. In this embodiment, the environmental information D2 is supposed to include, for example, information about at least one of temperature or lighting which may have an effect on the human model HM1. In addition, the environmental information D2 is also supposed to include information about an environment caused by a factor (such as heat) generated from the human model HM1.

The estimation unit 13 estimates the condition of the human model HM1 based on the model information D1 and the environmental information D2 as described above. In this embodiment, the condition of the human model HM1 to be estimated by the estimation unit 13 is, for example, "comfort." In other words, the estimation unit 13 estimates the comfort of the "human" based on the model information D1 and the environmental information D2 in a situation where the human model HM1 is replaced with the real "human." It will be described in detail later in the "(3) Operation" section exactly how to estimate the condition (comfort).

Figure 5:
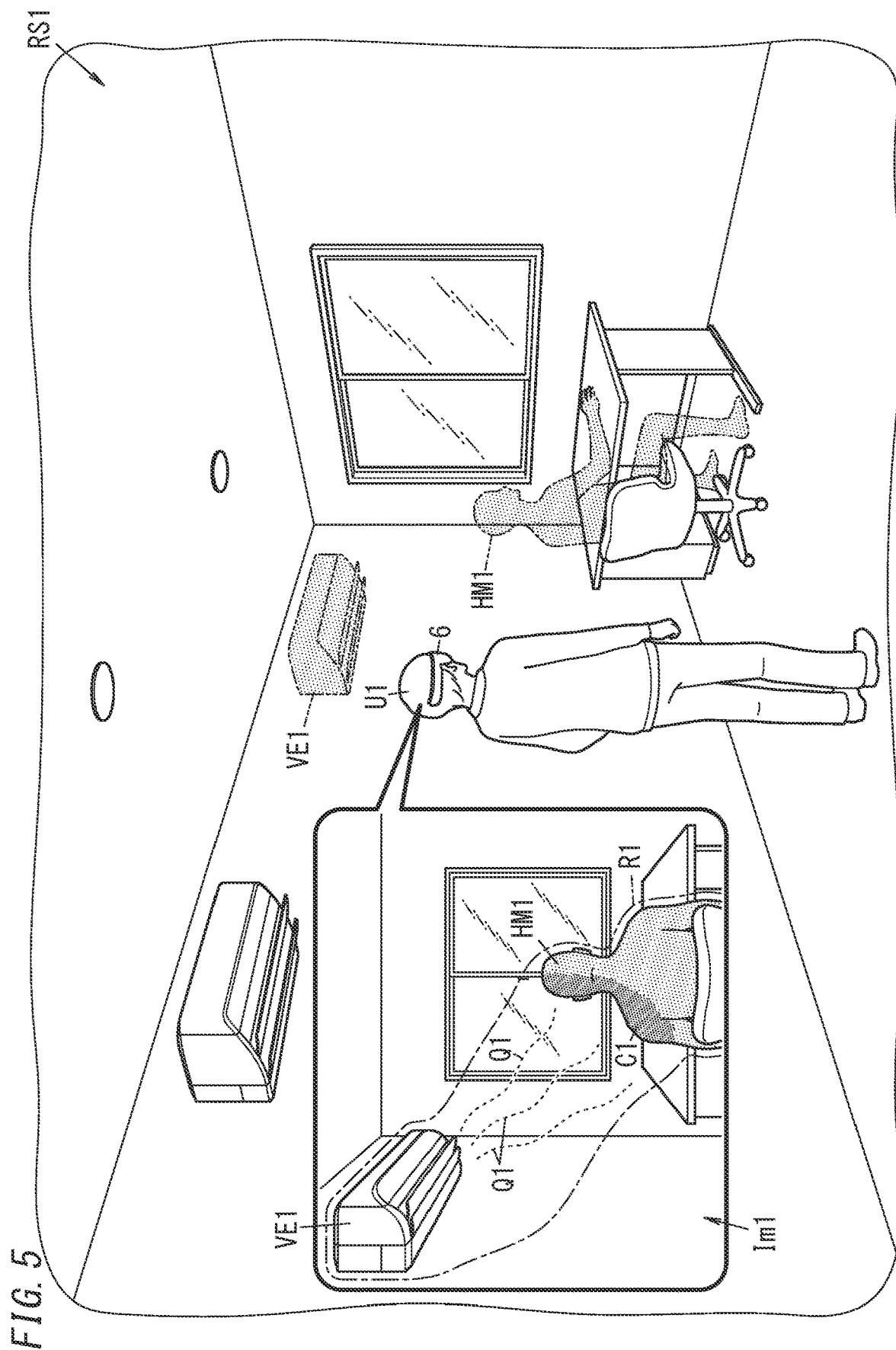
FIG. 5 is a conceptual diagram schematically depicting a real space to illustrate an exemplary use of the estimation system.

The presentation unit 14 presents the result of estimation made by the estimation unit 13 to the user U1 (see FIG. 5). In this embodiment, the presentation unit 14 presents the result of estimation made by the estimation unit 13 to the user U1 by displaying the result of estimation on the display device 6. Specifically, the presentation unit 14 displays, on the display device 6, the result of estimation made by the estimation unit 13 by transmitting, either at regular intervals or at irregular intervals, result information, indicating the result of estimation made by the estimation unit 13, to the display device 6 in response to a request from the display device 6.

In this embodiment, the presentation unit 14 displays a presentation screen image Im1 (see FIG. 5) indicating the result of estimation made by the estimation unit 13 and including the human model HM1. As used herein, a "screen image" such as the presentation screen image Im1 refers to an image (which may include a text, a graph, and/or an icon) displayed on the display device 6. That is to say, the presentation screen image Im1 indicating the result of estimation made by the estimation unit 13 is displayed on the display device 6 by the presentation unit 14. In addition, the human model HM1 is included in this presentation screen image Im1.

In this embodiment, the presentation unit 14 is configured to change a mode of display of the human model HM1 in the presentation screen image Im1 depending on the result of estimation made by the estimation unit 13. As used herein, examples of the "mode of display" include the color, motion (including deformation), brightness (including luminance), line type (including line thickness and whether the line is a solid line or a dashed line), and shape of the image displayed. That is to say, the mode of display (such as the color and other parameters) of the human model HM1 included in the presentation screen image Im1 changes depending on the result of estimation made by the estimation unit 13.

Furthermore, in this embodiment, the presentation screen image Im1 includes an augmented reality area R1 (see FIG. 5). In the augmented reality area R1, the human model HM1 is displayed to be superimposed on either the real space visible to the user's eye or an image representing the real space. That is to say, the presentation unit 14 realizes display of a so-called "augmented reality (AR)" by superimposing at least the human model HM1 on the real space (or an image representing the real space) in the presentation screen image Im1. The presentation screen image Im1 will be described in detail later in the "(3) Operation" section.

The conditioning unit 15 determines the number and/or arrangement of pieces of virtual equipment VE1-VE3 (see FIG. 1) provided in the virtual space VS1. The virtual equipment VE1-VE3 is used to condition an environment represented by the environmental information D2. In this example, the number of pieces of the virtual equipment VE1-VE3 may be set at any value within the range from zero to a predetermined upper limit (of 100, for example). Meanwhile, the pieces of the virtual equipment VE1-VE3 may be arranged at any coordinate positions in the virtual space VS1 and may have any arbitrary orientations.

The virtual equipment VE1-VE3, as well as the human model HM1, is a virtual model represented by data that may be processed by one or more processors and simulating the equipment arranged in the virtual space VS1. In other words, the virtual equipment VE1-VE3 is a virtual model rendered in the virtual space VS1 as if the virtual equipment VE1-VE3 were actually present there, and therefore, is not actually present in the real space (actual space) and is an insubstantial one. As used herein, the "equipment" refers to a piece of equipment (including appliances, tools, devices, and systems) contributing to forming an environment and may be a fixed one or a portable one, whichever is appropriate. For example, the virtual equipment VE1-VE3 corresponds to an air conditioner, a heater, a ventilation port, or any other means for conditioning (or producing) the "temperature" which is an environmental factor or lighting equipment, lighting window, or any other means for conditioning (or producing) the "lighting" which is another environmental factor.

In addition, in this embodiment, the estimation system 1 further includes a communications unit 16, an input unit 17, and a storage unit 18.

The communications unit 16 has the capability of communicating with each of the model generation unit 2, the environment generation unit 3, the database 4, the telecommunications device 5, and the display device 6. The communications unit 16 is able to establish bidirectional communication, over a network, for example, with each of the model generation unit 2, the environment generation unit 3, the database 4, the telecommunications device 5, and the display device 6.

The input unit 17 accepts input of an input signal in accordance with the user's U1 command. In other words, the estimation system 1 may accept the user's UI command. For example, the input unit 17 accepts the input of an input signal generated by the telecommunications device 5.

The storage unit 18 may store, for example, the model information D1 acquired by the first acquisition unit 11 and the environmental information D2 acquired by the second acquisition unit 12. In addition, the storage unit 18 further stores, for example, information that the estimation unit 13 needs to use to make computations. The storage unit 18 may include, for example, a programmable nonvolatile memory such as an electrically erasable programmable read-only memory (EEPROM).

The model generation unit 2 generates the model information D1. The model generation unit 2 outputs, to (the first acquisition unit 11 of) the estimation system 1, the model information D1 thus generated at either regular intervals or irregular intervals in response to a request from the estimation system 1. Optionally, the model generation unit 2 may selectively output, to the estimation system 1, an arbitrary type of model information D1 out of multiple types of model information D1 that have been generated in advance. The model information D1 includes at least information that needs to be used to allow the human model HM1 to have a form simulating a human body. In this embodiment, the model information D1 includes information about respective parts of a human body such as his or her head, breast, stomach, legs, and arms and information about respective organs of the human body such as his or her eyes, ears, nose, and mouth. The model information D1 further includes information about respective tissues of a human body such as his or her bones, muscles, blood, and skin.

Furthermore, the human model HM1 has a skeleton and joints which are either similar to, or simplified ones of, those of the human body, and therefore, may set up a motion in the same way as the human body does. This allows specifying, with respect to the human model HM1, a posture such as standing position or a sitting position or a motion (action) such as walking, raising an arm, or gripping an article. Information about such postures and motions of the human model HM1 is also included in the model information D1.

Furthermore, in this embodiment, the model information DI includes attribute information unique to the human model HM1. As used herein, the attribute information is information about the "human" simulated by the human model HM1 which indicates his or her age (or age group), sex, build (including the obesity index), liking (including whether he or she is sensitive to the heat or the cold), height, weight, gender, whether he or she is challenged or not, what is his or her challenge if the answer is YES, his or her activity level (including his or her heart rate), and his or her clothing level. Specifically, the human model HM1 may be classified into, for example, a model simulating a man in his twenties who is sensitive to the heat or a model simulating a woman in her sixties who is sensitive to the cold. For example, the attributes such as the age, sex, and build may define the human model's HM1 hands' reach and movable range of his or her joints. As will be described in detail later in the "(3) Operation" section, the estimation unit 13 varies the estimated condition of the human model HM1 according to the attribute information. In other words, the result of estimation made by the estimation unit 13 varies according to the attribute information represented by the model information D1.

The environment generation unit 3 generates the environmental information D2. The environment generation unit 3 may output, to (the second acquisition unit 12 of) the estimation system 1, the environmental information D2 thus generated at either regular intervals or irregular intervals in response to a request from the estimation system 1. Optionally, the environment generation unit 3 may selectively output, to the estimation system 1, an arbitrary type of environmental information D2 out of multiple types of environmental information D2 that have been generated in advance. The environmental information D2 includes at least information that needs to be used to allow the virtual space VS1 to have a shape simulating the internal space (interior space) of the facility (e.g., office in this example). For example, the environmental information D2 may include three-dimensional data such as building information modeling (BIM) data. In this embodiment, the environmental information D2 may include, for example, information about respective parts such as the floor, the walls, and the ceiling and information about their attributes and materials.

The environmental information D2 further includes information about the pieces of virtual equipment VE1-VE3 to be rendered in the virtual space VS1. That is to say, if a type of equipment for conditioning the environment has been installed (or introduced) in the facility (e.g., office in this example) corresponding to the virtual space VS1, then information about the virtual equipment VE1-VE3 corresponding to the equipment is included in the environmental information D2. Examples of the information about the virtual equipment VE1-VE3 include information about the type of the virtual equipment VE1-VE3 (which may be air conditioning equipment or lighting equipment, for example) and information about the number and arrangement of pieces of the virtual equipment VE1-VE3 (including the coordinate positions and orientations of the pieces of virtual equipment VE1-VE3 in the virtual space VS1). The environmental information D2 will be described in detail later in the "(3) Operation" section.

Meanwhile, in this embodiment, at least one of the model information D1 or the environmental information D2 changes with the passage of time. In other words, at least one of the model information D1 generated by the model generation unit 2 or the environmental information D2 generated by the environment generation unit 3 is not static information but dynamic information. In this embodiment, the model information D1 and the environmental information D2 are both supposed to be dynamic information that changes with the passage of time. The model information D1 and the environmental information D2 are suitably each updated automatically by machine learning, for example. For example, regarding the environmental information D2, the amount of insolation, the outside temperature, and other parameters of a facility (e.g., office in this example) corresponding to the virtual space VS1 will change incessantly. Therefore, the environmental information D2 suitably changes to keep up with this change.

The database 4 stores information for use mainly in the estimation made by the estimation unit 13. For example, the database 4 stores information such as evaluation indices indicating the effect that the facility (including a building) has on humans in terms of each of the air quality (Air), temperature (Temp), lighting (Light), and sound (Sound). Thus, on receiving a request signal from the estimation system 1, the database 4 outputs, to the estimation system 1, a result of collation in response to the request signal. Unlike the model information D1 and the environmental information D2, the information stored in the database 4 is static information that does not change with the passage of time.

The telecommunications device 5 includes, as major constituent elements, one or more processors and one or more memories. The processor performs the function of the telecommunications device 5 by executing a program stored in the memory. The program may be stored in advance in the memory. Alternatively, the program may also be distributed after having been stored in a non-transitory storage medium such as a memory card or downloaded via a telecommunications line. In other words, the program described above is designed to make the computer system function as the telecommunications device 5.

The telecommunications device 5 includes a user interface 51. In this embodiment, the telecommunications device 5 may be, for example, a tablet computer that the user U1 owns. The user interface 51 has the capability of accepting the user's U1 command and the capability of presenting information to the user U1. In this embodiment, the user interface 51 may be implemented as a touchscreen panel display. Thus, the telecommunications device 5 determines, by detecting some type of operation (such as tapping, swiping, or dragging) performed on an object such as a button on each screen image displayed on the touchscreen panel display, that a command should have entered through the object such as the button. That is to say, the telecommunications device 5 displays a screen image on a liquid crystal display, an organic electroluminescent (EL) display, or any other display device included in the touchscreen panel display.

The display device 6 may be implemented as, for example, an image display device such as a liquid crystal display or an organic EL display. In this embodiment, the display device 6 may be, for example, a head mounted display (HMD) that the user U1 wears on the head. This allows, when the presentation unit 14 conducts augmented reality display operation, the human model HM1 to be displayed to be superimposed on the real space visible to the user's eye as described above.

(3) Operation

Next, it will be described how the estimation system 1 according to this embodiment operates (i.e., how to carry out the estimation method according to this embodiment).

(3.1) Basic Operation

Figure 3:
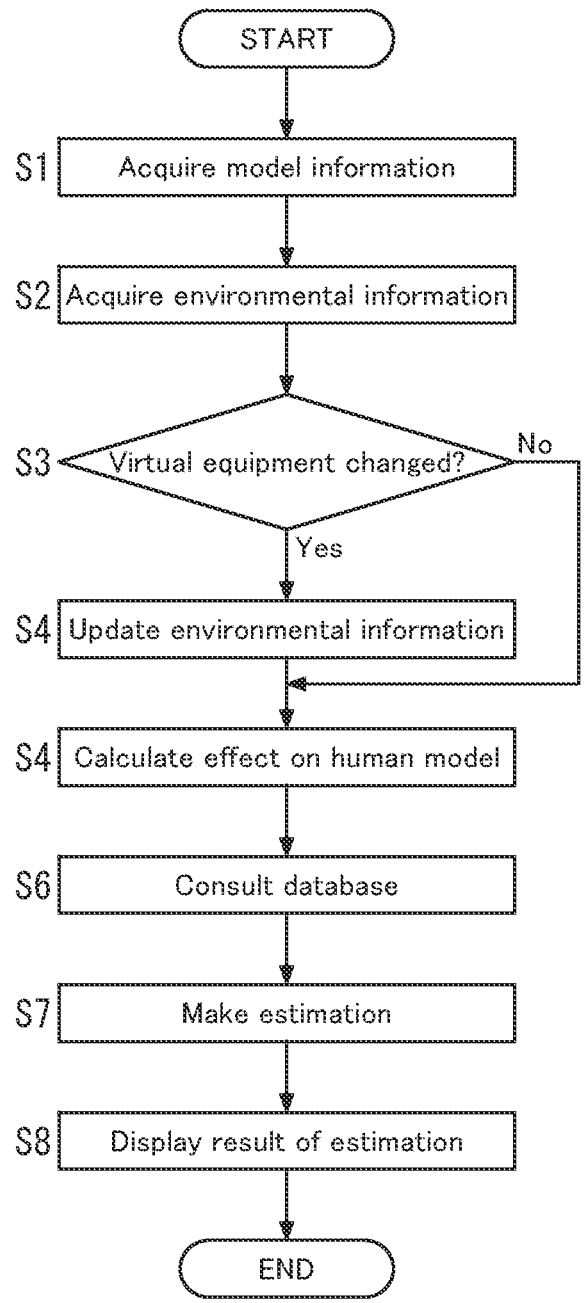
FIG. 3 is a flowchart showing an exemplary operation of the estimation system.

FIG. 3 is a flowchart showing an exemplary operation of the estimation system 1.

Specifically, first, the estimation system 1 makes the first acquisition unit 11 acquire the model information D1 from the model generation unit 2 (in Step S1) and also makes the second acquisition unit 12 acquire the environmental information D2 from the environment generation unit 3 (in Step S2).

Next, the estimation system 1 determines whether or not any change (including movement, addition, and erasure) has been made to the virtual equipment VE1-VE3 (in Step S3). That is to say, even though the environmental information D2 that the estimation system 1 has acquired from the environment generation unit 3 includes information about the virtual equipment VE1-VE3, the estimation system 1 may still change the virtual equipment VE1-VE3 in accordance with the user's U1 command, for example. For example, the user U1 may change the virtual equipment VE1-VE3 by performing, on a browser screen, an operation to change the virtual equipment VE1-VE3 by using the user interface 51 of the telecommunications device 5. When a command to change the virtual equipment VE1-VE3 has been entered through this operation performed by the user U1, the estimation system 1 receives an input signal in accordance with the command to decide that some change has been made to the virtual equipment VE1-VE3 (i.e., the answer to S3 is YES).

If any change has been made to the virtual equipment VE1-VE3 (i.e., if the answer to S3 is YES), then the estimation system 1 makes the conditioning unit 15 condition at least one of the number or arrangement of pieces of the virtual equipment VE1-VE3 in the virtual space VS1 and then updates the environmental information D2 (in Step S4). That is to say, the environmental information D2 that has been updated is information based on the environmental information D2 acquired from the environment generation unit 3 which has been changed in term of at least one of the number or arrangement of the pieces of the virtual equipment VE1-VE3. On the other hand, if no change has been made to the virtual equipment VE1-VE3 (if the answer is NO in Step S3), then the processing step S4 is skipped.

Next, the estimation system 1 makes the estimation unit 13 perform processing steps S5-S7 for estimating the condition of the human model HM1 based on the model information D1 and the environmental information D2. Specifically, the estimation system 1 creates the virtual space VS1 based on the environmental information D2 and also renders the human model HM1 in the virtual space VS1 based on the model information D1. Then, the estimation system 1 calculates, based on both the model information D1 and the environmental information D2, a particular effect that the environment in the virtual space VS1 will have on the human model HM1 rendered in the virtual space VS1 (in Step S5). If the environment that will have a particular effect on the human model HM1 is "temperature," for example, then the estimation unit 13 calculates an index value, corresponding to the skin temperature, with respect to each part of the human model HM1.

Next, based on the result of calculation obtained in the processing step S5, the estimation system 1 consults the database 4. At this time, in response to a request signal from the estimation system 1, the database 4 outputs a result of collation, corresponding to the request signal, to the estimation system 1 based on at least the result of calculation in the processing step S5. If the environment that will have a particular effect in the human model HM1 is "temperature," then an estimation value, indicating the degree of temperature-based comfort with respect to each part of the human model HM1, is output from the database 4 to the estimation system 1.

Then, the estimation system 1 estimates, based on the result of collation (including the estimation value) obtained from the database, the condition of the human model HM1 (in Step S7). In this embodiment, the "degree of comfort" is the target of estimation representing the condition of the human model HM1. Thus, at this time, the estimation unit 13 calculates an estimation value indicating the degree of comfort with respect to each part of the human model HM1.

When the condition of the human model HM1 has been estimated, the estimation system 1 presents the result of estimation to the user U1 (in Step S8) by making the presentation unit 14 display the result of estimation on the display device 6.

Note that the flowchart shown in FIG. 3 represents only an exemplary operation of the estimation system 1. Thus, any of the processing steps shown in FIG. 3 may be omitted as appropriate, any processing step may be added as appropriate, and/or the order in which the processing steps shown in FIG. 3 are performed may be changed as appropriate. For example, the processing step (S1) of making the first acquisition unit 11 acquire the model information D1 from the model generation unit 2 and the processing step (S2) of making the second acquisition unit 12 acquire the environmental information D2 from the environment generation unit 3 may be performed in reverse order.

(3.2) First Specific Exemplary Operation

Figure 4:
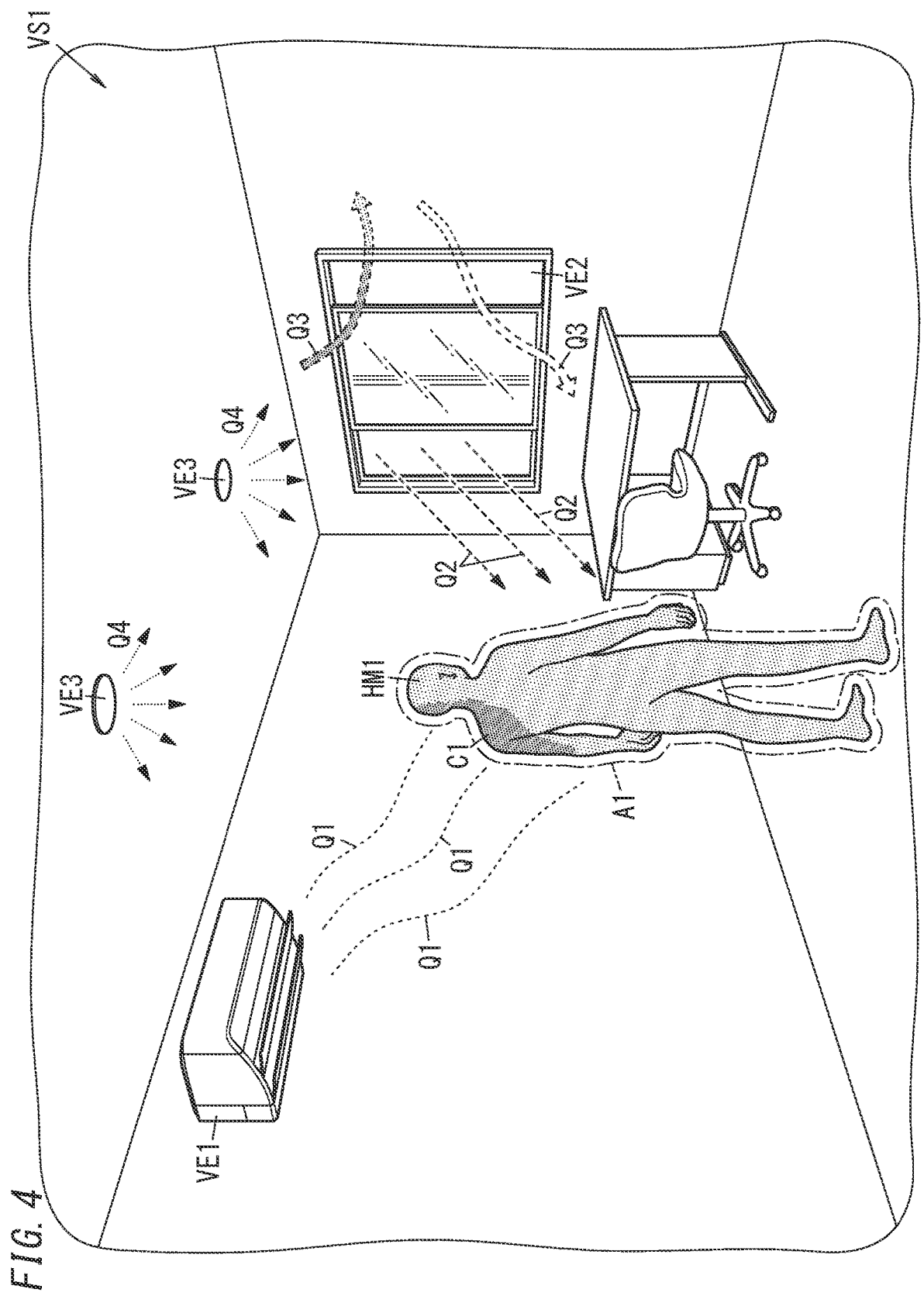
FIG. 4 is a conceptual diagram schematically depicting a virtual space to illustrate a specific exemplary operation of the estimation system.

Next, a specific exemplary operation of the estimation system 1 will be described with reference to FIG. 4 as to an exemplary situation where the environment that will have a particular effect on the human model HM1 is "temperature." FIG. 4 is a conceptual diagram schematically illustrating the virtual space VS1. In the example shown in FIG. 4, the human model HM1 is rendered to assume a standing position at a certain coordinate position around the center of the virtual space VS1. In addition, in the example shown in FIG. 4, a piece of virtual equipment VE1 corresponding to air conditioning equipment, another piece of virtual equipment VE2 corresponding to a window (such as a ventilation window or a lighting window), and two more pieces of virtual equipment VE3 respectively corresponding to two light fixtures are installed in the virtual space VS1.

As used herein, the environmental information D2 to be used by the estimation unit 13 to make estimation includes information about the environment in a surrounding area A1 which is defined around the human model HM1 in the virtual space VS1. As used herein, the surrounding area A1 only needs to be defined around the human model HM1 and may be defined as a range having a diameter of about a few to several ten centimeters from the surface (corresponding to the skin) of the human model HM1 when converted into a real space. In this embodiment, the surrounding area A1 is defined along the surface shape of the human model HM1 to cover the entire surface of the human model HM1.

Specifically, among various "temperatures" that will have a particular effect on a human, a temperature that will have a significantly dominant effect is the temperature of a space surrounding the human. Therefore, attention is suitably paid to, as a "temperature" that will have a particular effect on the human model HM1, the temperature in the surrounding area A1 to obtain the effect that the temperature will have on the human. In this embodiment, information about the environment (temperature) in the surrounding area A1 may be obtained in the following manner, for example.

First, the surrounding area A1 may be located based on information about the location of the human model HM1 in the virtual space VS1. That is to say, the surrounding area A1 is set at a certain coordinate position in the virtual space VS1.

As shown in FIG. 4, there are multiple pieces of virtual equipment VE1-VE3 in the virtual space VS1. Thus, the temperatures at respective positions in the virtual space VS1 are affected by these pieces of virtual equipment VE1-VE3. For example, the virtual equipment VE1 corresponding to the air conditioning equipment gives off heat Q1 by letting out hot air. Meanwhile, the virtual equipment VE2 corresponding to a window serving as a lighting window introduces, into the virtual space VS1, heat Q1 generated by radiation corresponding to sunlight (sunshine). In addition, the virtual equipment VE2 corresponding to the window also serves as a ventilation window, thus realizing transfer of heat Q3 by either ventilation or convection (i.e., exchange of heat between the virtual space VS1 and the outside). Furthermore, the virtual equipment VE3 corresponding to the lighting equipment gives off heat Q4 when the lighting equipment is lit (turned ON). As can be seen, main factors that determine the environment "temperature" include the heat Q1, Q4 given off from the pieces of equipment as heat sources (including air conditioning equipment, lighting equipment, and other types of electrical devices), the heat Q2 corresponding to the radiated heat of sunlight, for example, and the transfer of the heat Q3 caused by ventilation or convection. In addition, transfer of heat passing through the walls or windows, for example, due to heat conduction, transfer of heat due to convection in the virtual space VS1, and transfer of heat due to vaporization, for example, may also determine the environment "temperature" in the virtual space VS1.

Furthermore, since the human body also gives off heat, the heat given off from the human model HM1 is also suitably taken into account as for the human model HM1. In this embodiment, the environmental information D2 includes information about an environment caused by a factor (such as heat) generated from the human model HM1 as described above. In other words, the heat generated from the human model HM1 is also taken into account to determine the environment (temperature) of the surrounding area A1. The quantity of heat generated from the human model HM1 may be obtained accurately based on the attribute information included in the model information D1. For example, as the activity level (physical activity level) of the human model HM1 increases, the quantity of the metabolic heat produced by the human model HM1 increases. Furthermore, clothes may achieve thermal insulation or heat shielding effects. Thus, as the clothing level increases (i.e., as the thermal insulation effect of the clothes that the human model HM1 wears increases), the quantity of heat generated from the human model HM1 decreases.

Therefore, the quantity of heat input to, and output from, the surrounding area A1 is determined by synthesizing together the quantity of heat being transferred between the surrounding area A1 and the outside of the surrounding area A1 (i.e., the virtual space VS1) and the quantity of heat being transferred between the surrounding area A1 and the inside of the surrounding area A1 (i.e., the human model HM1). This allows the estimation unit 13 to calculate the environment (temperature) in the surrounding area A1. In addition, the estimation unit 13 calculates the temperature thus obtained in the surrounding area A1 as an index value corresponding to the skin temperature with respect to each part of the human model HM1.

The estimation unit 13 estimates the "comfort" indicating the condition of the human model HM1 based on the index value corresponding to the skin temperature with respect to each part of the human model HM1. In this case, basically, the closer to an appropriate temperature defined with respect to each part of the human model HM1 the temperature in the surrounding area A1 is, the higher the degree of comfort indicating the degree of comfortableness is (i.e., the closer to the "comfortable" one the condition of the human model HM1 is estimated to be). Meanwhile, the more distant from the appropriate temperature defined with respect to each part of the human model HM1 the temperature in the surrounding area A1 is, the lower the degree of comfort indicating the degree of comfortableness is (i.e., the closer to the "uncomfortable" one the condition of the human model HM1 is estimated to be).

The result of estimation (i.e., the degree of comfort) thus obtained also varies according to the attribute information (representing the activity level or the clothing level, for example) included in the model information D1. In other words, the estimation unit 13 changes the estimated condition of the human model HM1 depending on the attribute information included in the model information D1.

Also, when the comfort is estimated based on the temperature, the following factors that affect the thermal comfort are also suitably taken into account. Examples of such factors that affect the thermal comfort include atmospheric heat, a mean radiant temperature, an air velocity, and humidity. The atmospheric heat (air temperature) may be estimated by obtaining the temperature in the surrounding area A1 in the virtual space VS1 as described above. The mean radiant temperature may be estimated by calculating a weighted mean temperature of all surfaces exposed indoors in the virtual space VS1. The air velocity (or airflow) may be estimated by quantifying the velocity and direction of the air blowing indoors in the virtual space VS1. The humidity (or relative humidity) may be estimated by calculating the amount of moisture in the virtual space VS1. Furthermore, the activity level (physical activity level) of the human model HM1 and the clothing level described above may also affect the thermal comfort.

Therefore, the estimation system 1 contributes to allowing the estimation unit 13 to improve the estimation accuracy of the comfort of the human model HM1 by using, in combination, not only the atmospheric heat but also at least one piece of information selected from the group consisting of the mean radiant temperature, air velocity, humidity, activity level, and clothing level. In this case, even when the activity level and the clothing level are used, the estimation unit 13 also changes the estimated condition of the human model HM1 depending on the attribute information included in the model information D1.

(3.3) Exemplary Presentation

Next, a specific exemplary mode of presentation made by the presentation unit 14 will be described with reference to FIG. 5 as to an exemplary situation where the environment that will have a particular effect on the human model HM1 is "temperature." FIG. 5 is a conceptual diagram schematically illustrating a real space RSI. In the example illustrated in FIG. 5, the user U1 is standing around a center of the real space RSI. In addition, in the example illustrated in FIG. 5, a human model HM1 in a seating position is rendered beside a wall of the virtual space VS1. Furthermore, in the example illustrated in FIG. 5, a piece of virtual equipment VE1 corresponding to air conditioning equipment is rendered in the virtual space VS1 separately from the air conditioning equipment actually installed in the real space RS1. Furthermore, in the example illustrated in FIG. 5, the human model HM1 and the virtual equipment VE1 are illustrated in phantom (by two-dot chains) within the real space RSI. However, these are just illustrated there for the sake of description. The human model HM1 and the virtual equipment VE1 are actually not present in the real space RS1. In addition, in the example illustrated in FIG. 5, video visible to the user's eye U1 is shown inside the balloon.

In this embodiment, the presentation unit 14 presents the result of estimation made by the estimation unit 13 to the user UI by displaying the result on the display device 6 as described above. In this case, as shown inside the balloon, the presentation unit 14 displays, on the display device 6, a presentation screen image Im1 indicating the result of estimation made by the estimation unit 13 and including the human model HM1. In this embodiment, the display device 6 is a head mounted display used by the user U1 by wearing the display device 6 on the head, thus enabling the human model HM1 to be displayed to be superimposed on the real space RSI to the user's U1 eyes (as shown inside the balloon). Thus, to the user's U1 eyes, the presentation screen image Im1 may be displayed as an augmented reality in which the human model HM1 is displayed as an image superimposed on the real space RS1.

As can be seen, the presentation screen image Im1 displayed by presentation unit 14 includes an augmented reality in which the human model HM1 is displayed as an image superimposed on the real space RS1 visible to the user's U1 eye. This allows the user U1 to visually recognize the human model HM1 as if the human model HM1 were a human actually present in the real space RSI, thus enabling the estimation system 1 to present the result of estimation of the condition of the human model HM1 to the user UI more realistically.

Furthermore, in the example illustrated in FIG. 5, not only the human model HM1 but also the virtual equipment VE1 and the heat Q1 (hot air) given off from virtual equipment VE1 are displayed in the augmented reality area R1. This allows the user U1 to visually check the effect that will be produced when equipment corresponding to the virtual equipment VE1 (e.g., air conditioning equipment in this example) is actually installed in the real space RS1.

Furthermore, according to this embodiment, the presentation unit 14 changes the mode of display of the human model HM1 in the presentation screen image Im1 depending on the result of estimation made by the estimation unit 13 (e.g., the degree of comfort in this example). In the example illustrated in FIG. 5, the temperature of a part C1, exposed directly to the heat QI given off from the virtual equipment VE1, of the human model HM1 is much higher than an appropriate temperature, and therefore, the degree of comfort in that part C1 is lower than in other parts. Since the result of estimation is as such, in the example illustrated in FIG. 5, the part C1 (around his or her left shoulder), exposed directly to the heat Q1 given off from the virtual equipment VE1, of the human model HM1 is displayed in a different color from the other parts of the human model HM1. As can be seen, changing the mode of display of the human model HM1 in the presentation screen image Im1 depending on the result of estimation made by the estimation unit 13 allows the user U1 to more easily recognize the result of estimation made by the estimation unit 13.

(3.4) Second Specific Exemplary Operation

Figure 6:
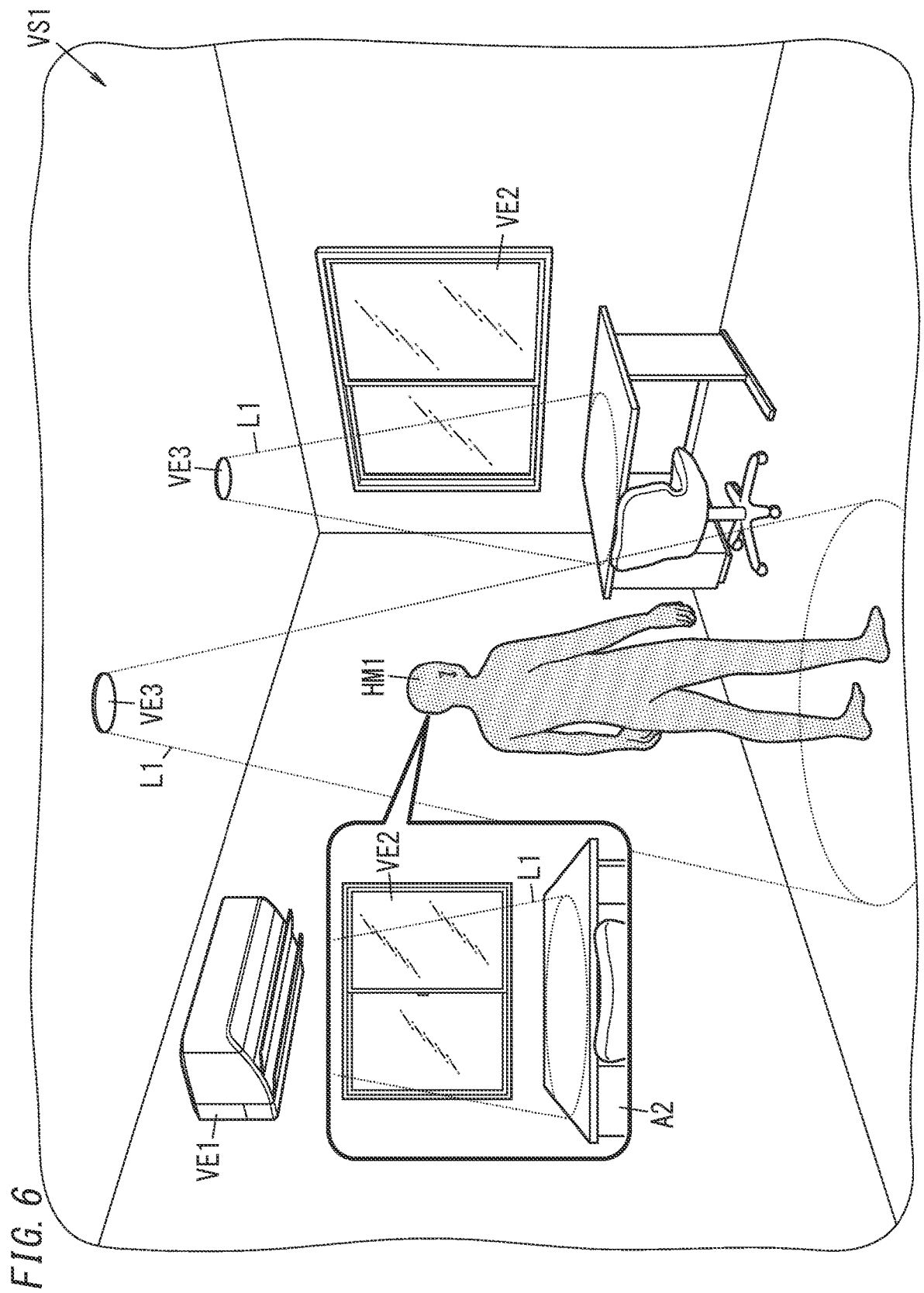
FIG. 6 is a conceptual diagram schematically depicting a virtual space to illustrate a specific exemplary operation of the estimation system.

Next, a specific exemplary operation of the estimation system 1 will be described with reference to FIG. 6 as to an exemplary situation where the environment that will have a particular effect on the human model HM1 is "lighting." FIG. 6 is a conceptual diagram schematically illustrating the virtual space VS1. In the example illustrated in FIG. 6, the human model HM1 is rendered to assume a standing position at a certain coordinate position around the center of the virtual space VS1. In addition, in the example illustrated in FIG. 6, a piece of virtual equipment VE1 corresponding to air conditioning equipment, another piece of virtual equipment VE2 corresponding to a window (such as a ventilation window or a lighting window), and two more pieces of virtual equipment VE3 respectively corresponding to two light fixtures are installed in the virtual space VS1. Furthermore, in the example illustrated in FIG. 6, a viewing area A2 corresponding to the field of view (sight) of the human model HM1 is shown inside the balloon.

Specifically, among various parameters of "lighting" that will have a particular effect on a human, parameters that will have a significantly dominant effect are brightness (illuminance) and light color within the human's field of view. Therefore, attention is suitably paid to, as "lighting" that will have a particular effect on the human model HM1, the brightness (illuminance) and light color within the human model's HM1 field of view (viewing area A2). In this embodiment, information about the environment (lighting) in the viewing area A2 corresponding to the field of view of the human model HM1 may be obtained in the following manner, for example.

First, the viewing area A2 corresponding to the field of view of the human model HM1 may be determined by information about the location of the human model HM1 in the virtual space VS1 and information about the head orientation of the human model HM1 in the virtual space VS1. That is to say, an area originating from a certain coordinate position within the virtual space VS1 and extending in a certain direction is estimated to be the viewing area A2.

As shown in FIG. 6, there are two pieces of virtual equipment VE3 corresponding to the light fixtures in the virtual space VS1. Thus, the brightness (illuminance) and light color at each position in the virtual space VS1 are affected by at least the two pieces of virtual equipment VE3. That is to say, each piece of virtual equipment VE3 emits light L1 when lit (i.e., turned ON). One piece of virtual equipment VE3, located closer to the virtual equipment VE2, out of the two pieces of virtual equipment VE3 irradiates the surface of a desk in the viewing area A2 with the light L1. In addition, in the example illustrated in FIG. 6, the virtual equipment VE2, corresponding to a window serving as a lighting window, also irradiates the virtual space VS1 with light by letting in the sunlight (sunshine). Furthermore, reflection or absorption of light from/into the walls, floor, or ceiling and shadows cast by having incoming light cut off by objects may also determine the environment that is "lighting" in the virtual space VS1.

Thus, the estimation unit 13 may calculate, as index values, the brightness (illuminance) and light colors in the viewing area A2. The estimation unit 13 estimates, based on the index values indicating the brightness (illuminance) and light colors in the viewing area A2, the "comfort" representing the condition of the human model HM1.

In this case, basically, the closer to an appropriate illuminance the brightness in the viewing area A2 is, the higher the degree of comfort indicating the degree of comfortableness is (i.e., the closer to the "comfortable" one the condition of the human model HM1 is estimated to be). Meanwhile, the more distant from the appropriate illuminance the brightness in the viewing area A2 is, the lower the degree of comfort indicating the degree of comfortableness is (i.e., the closer to the "uncomfortable" one the condition of the human model HM1 is estimated to be). The appropriate illuminance is suitably determined, for example, adaptively to the intended use of a facility simulated by the virtual space VS1. For example, when the virtual space VS1 simulates an office, the appropriate illuminance is set at a relatively high illuminance. On the other hand, when the virtual space VS1 simulates a restaurant or any other establishment, the appropriate illuminance is set at a relatively low illuminance.

In the same way, the closer to an appropriate color temperature the light color in the viewing area A2 is, the higher the degree of comfort indicating the degree of comfortableness is (i.e., the closer to the "comfortable" one the condition of the human model HM1 is estimated to be). Meanwhile, the more distant from the appropriate color temperature the light color in the viewing area A2 is, the lower the degree of comfort indicating the degree of comfortableness is (i.e., the closer to the "uncomfortable" one the condition of the human model HM1 is estimated to be). The appropriate color temperature is suitably determined, for example, adaptively to the intended use of a facility simulated by the virtual space VS1. For example, when the virtual space VS1 simulates an office, the appropriate color temperature is set at a relatively high color temperature. On the other hand, when the virtual space VS1 simulates a restaurant or any other establishment, the appropriate color temperature is set at a relatively low color temperature.

(4) Variations

Note that the first embodiment described above is only an exemplary one of various embodiments of the present disclosure and should not be construed as limiting. Rather, the first embodiment may be readily modified in various manners depending on a design choice or any other factor without departing from the scope of the present disclosure. The drawings to be referred to in this description of embodiments are all schematic representations. The ratio of the dimensions (including thicknesses) of respective constituent elements illustrated on the drawings does not always reflect their actual dimensional ratio. The functions of the estimation system 1 according to the first embodiment may also be implemented as an estimation method, a computer program, or a non-transitory storage medium on which the computer program is stored, for example. An estimation method according to an aspect includes a first acquisition step (corresponding to "S1" shown in FIG. 3), a second acquisition step (corresponding to "S2" shown in FIG. 3), and an estimation step (corresponding to "S5-S7" shown in FIG. 3). The first acquisition step includes acquiring model information D1. The model information D1 is information about a human model HM1 rendered in a virtual space VS1. The human model HM1 is generated based on model data of a human. The second acquisition step includes acquiring environmental information D2. The environmental information D2 is information about an environment corresponding to the virtual space VS1 and potentially having a particular effect on the human model HM1. The estimation step includes estimating a condition of the human model HM1 based on the model information D1 and the environmental information D2. A (computer) program according to another aspect is designed to cause one or more processors to carry out the estimation method described above.

Next, variations of the first embodiment will be enumerated one after another. Note that the variations to be described below may be adopted in combination as appropriate.

The estimation system 1 according to the present disclosure includes a computer system. The computer system includes a processor and a memory as principal hardware components. The functions of the estimation system 1 according to the present disclosure may be performed by making the processor execute a program stored in the memory of the computer system. The program may be stored in advance in the memory of the computer system. Alternatively, the program may also be downloaded through a telecommunications line or be distributed after having been recorded in some non-transitory storage medium such as a memory card, an optical disc, or a hard disk drive, any of which is readable for the computer system. The processor of the computer system may be made up of a single or a plurality of electronic circuits including a semiconductor integrated circuit (IC) or a large-scale integrated circuit (LSI). As used herein, the "integrated circuit" such as an IC or an LSI is called by a different name depending on the degree of integration thereof. Examples of the integrated circuits include a system LSI, a very large-scale integrated circuit (VLSI), and an ultra large-scale integrated circuit (ULSI). Optionally, a field-programmable gate array (FPGA) to be programmed after an LSI has been fabricated or a reconfigurable logic device allowing the connections or circuit sections inside of an LSI to be reconfigured may also be adopted as the processor. Those electronic circuits may be either integrated together on a single chip or distributed on multiple chips, whichever is appropriate. Those multiple chips may be integrated together in a single device or distributed in multiple devices without limitation. As used herein, the "computer system" includes a microcontroller including one or more processors and one or more memories. Thus, the microcontroller may also be implemented as a single or a plurality of electronic circuits including a semiconductor integrated circuit or a largescale integrated circuit.

Also, in the embodiment described above, at least some constituent elements (or the functions) of the estimation system 1 are integrated together in a single housing. However, this is only an example and should not be construed as limiting. Alternatively, those constituent elements (or functions) of the estimation system 1 may be distributed in multiple different housings. For example, the first acquisition unit 11 and the second acquisition unit 12 of the estimation system 1 may be provided in a different housing from the estimation unit 13. Still alternatively, at least some functions of the estimation system 1 (e.g., the function of the estimation unit 13) may be implemented as a cloud computing system as well.

Conversely, at least some functions distributed in multiple devices according to the first embodiment may be integrated together in a single housing. For example, the functions distributed in the estimation system 1 and the database 4 may be integrated together in a single housing.

In the first embodiment described above, the estimation system 1 does not include the model generation unit 2, the environment generation unit 3, the database 4, the telecommunications device 5, or the display device 6 as its constituent element. However, this is only an example and should not be construed as limiting. Alternatively, at least one of the model generation unit 2, the environment generation unit 3, the database 4, the telecommunications device 5, or the display device 6 may be among constituent elements of the estimation system 1. For example, the estimation system 1 may include the model generation unit 2 and the environment generation unit 3.

Also, the input unit 17 has only to be configured to accept input of an input signal in accordance with the user's UI command and does not have to accept the input of an input signal generated by the telecommunications device 5. Alternatively, the input unit 17 may also accept input of an input signal from any other type of input device such as a touchscreen panel display, a keyboard, a pointing device, or an audio input device.

Furthermore, the environmental information D2 does not have to be temperature and lighting that will have an effect on the human model HM1 but may also include one or more factors selected from sounds (including machinery's operating sounds, voices, and noises), odors, and air quality, either in addition to, or instead of, at least one of temperature or lighting. For example, if the environmental information D2 includes information about a "sound" that may have an effect on the human model HM1, then examples of the virtual equipment VE1-VE3 include a TV receiver, loudspeaker, and other pieces of equipment for adjusting (and generating) "sounds."

Furthermore, in the first embodiment described above, the model information D1 and the environmental information D2 are both supposed to be dynamic information that changes with the passage of time. However, this is only an example and should not be construed as limiting. Alternatively, at least one of the model information D1 or the environmental information D2 may also be static information that does not change with the passage of time. Still alternatively, both of the model information D1 or the environmental information D2 may also be static information that does not change with the passage of time.

Furthermore, the result of estimation made by the estimation unit 13 does not have to be presented to the user U1 by the presentation unit 14 but may also be output in any mode other than presentation to the user UI. Examples of modes of outputting the result of estimation to the user U1 other than presentation include sending out the result via communication (including outputting log data), writing the result onto a non-transitory storage medium, printing out, and other means.

Furthermore, the mode of presenting the result of estimation to the user U1 using the presentation unit 14 does not have to be displaying the result but may also be sending out the result to the telecommunications device 5, emitting a sound (which may also be a voice or an alarm sound), emitting light (which may also be flashing light), printing out, and other means.

Furthermore, the presentation screen image Im1 displayed on the presentation unit 14 has only to include the augmented reality area R1 and may further include a display area other than the augmented reality area R1. In other words, the presentation screen image Im1 may include the augmented reality area R1 for use to conduct augmented reality display operation and an area for use to conduct a normal display operation other than the augmented reality display operation.

Furthermore, in the first embodiment described above, the display device 6 is implemented as a head mounted display. However, this is only an example and should not be construed as limiting. Alternatively, the display device 6 may also be implemented as a smartphone or a tablet computer, for example. Even in that case, the augmented reality display operation may also be conducted by capturing an image of the real space RS1 with a camera of the display device 6 and superimposing the human model HM1 on the image of the real space RSI thus captured. That is to say, the presentation screen image Im1 has only to include the augmented reality area R1 in which the human model HM1 is displayed as an image superimposed on either the real space RSI visible to the user's U1 eye or an "image" of the real space RS1. Furthermore, the presentation screen image Im1 does not have to include the augmented reality area RI.

Second Embodiment

Figure 7:
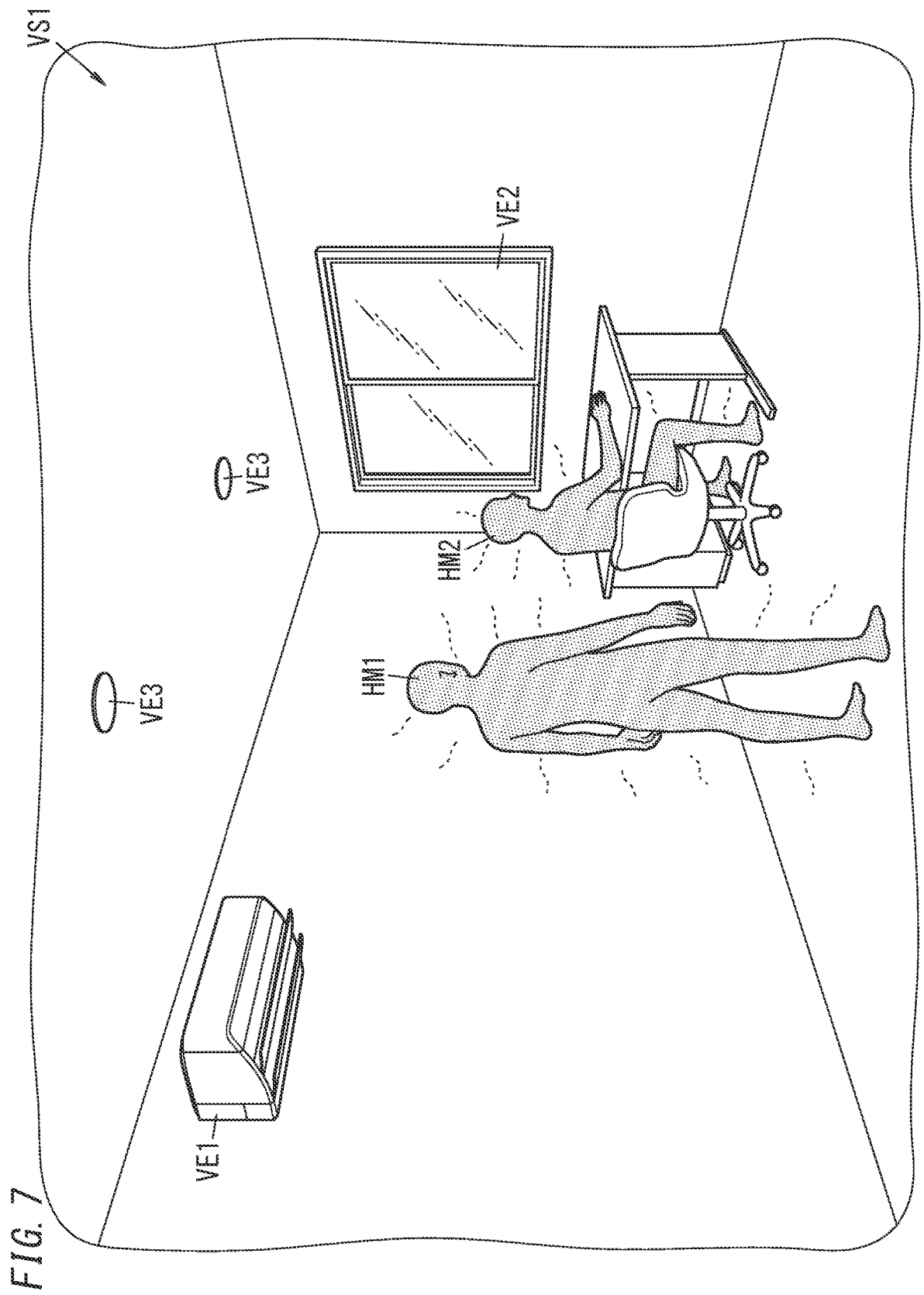
FIG. 7 is a conceptual diagram schematically depicting a virtual space for use in an estimation system according to a second embodiment.

In an estimation system 1 according to a second embodiment, a plurality of human models HM1, HM2 are rendered as shown in FIG. 7 in the virtual space VS1, which is a major difference from the estimation system 1 according to the first embodiment. In the following description, any constituent element of this second embodiment, having the same function as a counterpart of the first embodiment described above, will be designated by the same reference numeral as that counterpart's, and description thereof will be omitted as appropriate herein.

Specifically, in the first embodiment described above, a single human model HM1 is rendered in the virtual space VS1. On the other hand, in this embodiment, a plurality of human models HM1, HM2 are rendered in the virtual space VS1. In addition, in this embodiment, the first acquisition unit 11 is configured to be able to acquire model information D1 with respect to each of the plurality of human models HM1, HM2.

In the example illustrated in FIG. 7, two human models HM1, HM2 are rendered in the virtual space VS1. One human model HM1 is rendered to assume a standing position at a certain coordinate position around the center of the virtual space VS1. The other human model HM2 is rendered to assume a sitting position beside a wall of the virtual space VS1.

In the estimation system 1 according to this embodiment, the first acquisition unit 11 may acquire model information D1 with respect to each of the human model HM1 in the standing position and the human model HM2 in the sitting position. Then, the estimation system 1 makes the estimation unit 13 estimate, based on the model information D1 and the environmental information D2 that have been acquired on an individual basis with respect to each of the plurality of human models HM1, HM2, their conditions (such as their comfort). In that case, the results of estimation are suitably presented to be distinguishable from each other with respect to the respective human models HM1, HM2.

In this case, the environmental information D2 includes interaction information as a piece of information about an environment that may have a particular effect on a first model, which is one human model selected from the group consisting of the plurality of human models HM1, HM2. The interaction information is a piece of information about at least one human model HM1, HM2, other than the first model, out of the plurality of human models HM1, HM2. For example, suppose one human model HM1, selected from the plurality of human models HM1, HM2, is the first model. In that case, the environmental information D2 includes, as a piece of information about an environment that may have a particular effect on the first model (that is the human model HM), interaction information about the human model HM2 other than the first model.

Specifically, if a plurality of humans are present in the single space, for example, those humans may interact with each other with respect to various environmental factors such as temperature, lighting, sounds, odors, and air quality. Thus, the environmental information D2 includes, as a piece of information about an environment that may have a particular effect on the first model (that is the human model HM1), interaction information about the human model HM2 other than the first model, thus reproducing such an interaction. For example, if the environment that may have a particular effect on the human models HM1, HM2 is "temperature," then the heat given off from the human model HM2 may have a particular effect on the first model (that is the human model HM1). Thus, having the interaction information about the human model HM2 other than the first model included in the environmental information D2 for use to estimate the condition of the first model (that is the human model HM1) allows the interaction between the human models HM1. HM2 to be used as an aid to estimation made by the estimation unit 13.

This allows the estimation system 1 to reflect, on its result of estimation to be obtained when comfort is estimated as the conditions of the human models HM1. HM2, for example, a decline in the degree of comfort that humans sense when a plurality of humans gather densely in a single place.

In the foregoing description, the human model HM1 is supposed to be the first model. However, this is only an example and should not be construed as limiting. Alternatively, the human model HM2 may also be the first model.

In that case, the environmental information D2 includes, as a piece of information about an environment that may have a particular effect on the first model (that is the human model HM2), interaction information about the human model HM1 other than the first model.

Furthermore, in the estimation system 1 according to the second embodiment, the environmental information D2 does not have to include the interaction information. Alternatively, the environmental information D2 may include no interaction information.

Also, in the second embodiment, at least two human models HM1, HM2 need to be rendered in the virtual space VS1. Thus, for example, three or more human models HM1 may be rendered in the virtual space VS1.

Optionally, the various configurations (including variations) that have been described for the second embodiment may be adopted as appropriate in combination with the various configurations (including variations) that have been described for the first embodiment.

(Recapitulation)

As can be seen from the foregoing description, an estimation system (1) according to a first aspect includes a first acquisition unit (11), a second acquisition unit (12), and an estimation unit (13). The first acquisition unit (11) acquires model information (DI). The model information (D1) is information about a human model (HM1, HM2) rendered in a virtual space (VS1). The human model (HM1, HM2) is generated based on model data of a human. The second acquisition unit (12) acquires environmental information (D2). The environmental information (D2) is information about an environment corresponding to the virtual space (VS1) and potentially having a particular effect on the human model (HM1, HM2). The estimation unit (13) estimates a condition of the human model (HM1, HM2) based on the model information (D1) and the environmental information (D2).

According to this aspect, an environment corresponding to the virtual space (VS1) and potentially having a particular effect on the human model (HM1. HM2) may be taken into account when the condition of the human model (HM1, HM2) is estimated. For example, in a real space (RSI), various environments such as temperature (heat) and lighting (light) have a particular effect on a human who is actually present in the real space (RS1). Consequently, the degree of comfort, for example, of the human varies according to the effect that the environment has on the human. Applying such an environment-based approach to the virtual space (VS1) where the human model (HM1. HM2) is rendered allows this estimation system (1) to estimate and approximate the condition of the human model (HM1, HM2) more closely to the human in the real space. Therefore, this achieves the advantage of contributing to improving the estimation accuracy of the condition of the human model (HM1, HM2).

In an estimation system (1) according to a second aspect, which may be implemented in conjunction with the first aspect, at least one of the model information (D1) or the environmental information (D2) changes with passage of time.

This aspect allows the condition of the human model (HM1, HM2) to be estimated based on dynamic information that changes with passage of time.

An estimation system (1) according to a third aspect, which may be implemented in conjunction with the first or second aspect, further includes a presentation unit (14). The presentation unit (14) presents, to a user (U1), a result of estimation made by the estimation unit (13).

This aspect allows the user (U1) to use the result of estimation in, for example, designing, reforming, and evaluating facilities, making marketing in the construction industry, and doing technical studies and developments.

In an estimation system (1) according to a fourth aspect, which may be implemented in conjunction with the third aspect, the presentation unit (14) presents the result of estimation made by the estimation unit (13) by displaying a presentation screen image (Im1) indicating the result of estimation made by the estimation unit (13) and including the human model (HM1, HM2). In addition, the presentation unit (14) changes a mode of display of the human model (HM1, HM2) in the presentation screen image (Im1) depending on the result of estimation made by the estimation unit (13).

This aspect allows the user (UI) to visually recognize, based on the mode of display of the human model (HM1, HM2), the estimated condition of the human model (HM1, HM2) more easily.

In an estimation system (1) according to a fifth aspect, which may be implemented in conjunction with the fourth aspect, the presentation screen image (Im1) includes an augmented reality area (R1). In the augmented reality area (R1), the human model (HM1, HM2) is displayed to be superimposed on either a real space (RSI) visible to an eye of the user (U1) or an image representing the real space (RS1).

This aspect allows the user (U1) to visually recognize the human model (HM1, HM2) as if the human model (HM1, HM2) were a human who is actually present in the real space (RS1). Consequently, the estimation system (1) may present the estimated condition of the human model (HM1, HM2) to the user more realistically.

In an estimation system (1) according to a sixth aspect, which may be implemented in conjunction with any one of the first to fifth aspects, the human model (HM1, HM2) includes a plurality of human models (HM1, HM2) which are rendered in the virtual space (VS1). The first acquisition unit (11) may acquire the model information (DI) with respect to each of the plurality of human models (HM1, HM2).

This aspect allows the respective conditions of the plurality of human models (HM1, HM2) to be estimated collectively.

In an estimation system (1) according to a seventh aspect, which may be implemented in conjunction with the sixth aspect, the environmental information (D2) includes interaction information as a piece of information about the environment potentially having the particular effect on a first model. The first model is one of the plurality of human models (HM1, HM2).

The interaction information is a piece of information about at least one human model (HM1, HM2), other than the first model, out of the plurality of human models (HM1, HM2).

This aspect allows interaction, which may be caused in a situation where a plurality of humans are present in a single space, to be reproduced when the conditions of the human models (HM1, HM2) are estimated.

In an estimation system (1) according to an eighth aspect, which may be implemented in conjunction with any one of the first to seventh aspects, the model information (D1) includes attribute information unique to the human model (HM1, HM2). The estimation unit (13) adaptively changes the condition estimated for the human model (HM1, HM2) according to the attribute information.

This aspect allows various parameters unique to the given human, including his or her age, sex, build, liking, height, weight, gender, whether he or she is challenged or not, what is his or her challenge if the answer is YES, his or her activity level, and his or her clothing level, to be taken into account when the condition of the human model (HM1, HM2) is estimated.

In an estimation system (1) according to a ninth aspect, which may be implemented in conjunction with any one of the first to seventh aspects, the environmental information (D2) includes information about an environment of a surrounding area (A1) set around the human model (HM1, HM2) in the virtual space (VS1).

This aspect allows the environment in the surrounding area (A1), which would have a significant effect on the human model (HM1. HM2), to be taken into account when the condition of the human model (HM1, HM2) is estimated.

In an estimation system (1) according to a tenth aspect, which may be implemented in conjunction with the ninth aspect, the environmental information (D2) includes information about an environment caused by a factor generated from the human model (HM1, HM2).

This aspect allows the effect that the human model (HM1. HM2) itself would have on the environment to be taken into account when the condition of the human model (HM1, HM2) is estimated.

In an estimation system (1) according to an eleventh aspect, which may be implemented in conjunction with any one of the first to tenth aspects, the environmental information (D2) includes information about at least one of temperature or lighting that potentially has an effect on the human model (HM1, HM2).

This aspect allows at least one of temperature or lighting that tends to have a particular effect on a human to be taken into account when the condition of the human model (HM1, HM2) is estimated.

An estimation system (1) according to a twelfth aspect, which may be implemented in conjunction with any one of the first to eleventh aspects, further includes a conditioning unit (15).

The conditioning unit (15) determines a numerical number and/or arrangement of pieces of virtual equipment (VE1-VE3) provided in the virtual space (VS1). The virtual equipment (VE1-VE3) is used to condition an environment represented by the environmental information (D2).

This aspect allows the number and arrangement of the pieces of virtual equipment (VE1-VE3) provided in the virtual space (VS1) to be changed.

A space design support system according to a thirteenth aspect includes: the estimation system (1) according to the fourth or fifth aspect, and a display device (6). The presentation unit (14) makes the display device (6) display a presentation screen image (Im1).

This aspect contributes to improving the estimation accuracy of the condition of the human model (HM1, HM2).

In a space design support system according to a fourteenth aspect, which may be implemented in conjunction with the thirteenth aspect, the virtual space (VS1) is a space that simulates a real space. The presentation unit (14) makes the display device (6) display the presentation screen image (Im1) indicating the estimated condition of the human model (HM1, HM2) in the virtual space (VS1).

This aspect allows the user (U1) to visually recognize, based on the mode of display of the human model (HM1, HM2), the estimated condition of the human model (HM1. HM2) more easily.

An estimation method according to a fifteenth aspect includes a first acquisition step, a second acquisition step, and an estimation step. The first acquisition step includes acquiring model information (D1). The model information (D1) is information about a human model (HM1, HM2) rendered in a virtual space (VS1). The human model (HM1, HM2) is generated based on model data of a human. The second acquisition step includes acquiring environmental information (D2). The environmental information (D2) is information about an environment corresponding to the virtual space (VS1) and potentially having a particular effect on the human model (HM1, HM2). The estimation step includes estimating a condition of the human model (HM1, HM2) based on the model information (DI) and the environmental information (D2).

According to this aspect, an environment corresponding to the virtual space (VS1) and potentially having a particular effect on the human model (HM1. HM2) may be taken into account when the condition of the human model (HM1, HM2) is estimated. For example, in a real space (RS1), various environments such as temperature (heat) and lighting (light) have a particular effect on a human who is actually present in the real space (RSI). Consequently, the degree of comfort, for example, of the human varies according to the effect that the environment has on the human. Applying such an environment-based approach to the virtual space (VS1) where the human model (HM1, HM2) is rendered allows this estimation method to estimate and approximate the condition of the human model (HM1, HM2) more closely to the human in the real space. Therefore, this achieves the advantage of contributing to improving the estimation accuracy of the condition of the human model (HM1, HM2).

A program according to a sixteenth aspect is designed to cause one or more processors to carry out the estimation method according to the fifteenth aspect.

According to this aspect, an environment corresponding to the virtual space (VS1) and potentially having a particular effect on the human model (HM1, HM2) may be taken into account when the condition of the human model (HM1, HM2) is estimated. For example, in a real space (RS1), various environments such as temperature (heat) and lighting (light) have a particular effect on a human who is actually present in the real space (RS1). Consequently, the degree of comfort, for example, of the human varies according to the effect that the environment has on the human. Applying such an environment-based approach to the virtual space (VS1) where the human model (HM1, HM2) is rendered allows this program to estimate and approximate the condition of the human model (HM1, HM2) more closely to the human in the real space. Therefore, this achieves the advantage of contributing to improving the estimation accuracy of the condition of the human model (HM1, HM2).

Note that these are not the only aspects of the present disclosure but various configurations of the estimation system (1) according to the first and second embodiments (including variations thereof) may also be implemented as an estimation method or a program.

It should also be noted that the constituent elements according to the second to twelfth aspects are not essential constituent elements for the estimation system (1) but may be omitted as appropriate.

REFERENCE SIGNS LIST

1 Estimation System
11 First Acquisition Unit
12 Second Acquisition Unit
13 Estimation Unit
14 Presentation Unit
Conditioning Unit
A1 Surrounding Area
D1 Model Information
D2 Environmental Information
HM1, HM2 Human Model
Im1 Presentation Screen Image
R1 Augmented Reality Area
RS1 Real Space
U1 User
VS1 Virtual Space
VE1-VE3 Virtual Equipment

The invention claimed is:

1. An estimation system comprising one or more processors, the one or more processors being configured to:
acquire model information about a human model rendered in a virtual space and generated based on model data of a human;
acquire environmental information about an environment corresponding to the virtual space and potentially having a particular effect on the human model;
estimate a condition of the human model based on the model information and the environmental information; and
present, to a user, a result of an estimation made by the estimating,
the one or more processors being further configured to:
present the result of the estimation made by the estimating by displaying a presentation screen image indicating the result of the estimation made by the estimating and including the human model; and
change a mode of display of the human model in the presentation screen image depending on the result of the estimation made by the estimating, and
the presentation screen image including an augmented reality area in which the human model is displayed to be superimposed on either a real space visible to an eye of the user or an image representing the real space.

2. The estimation system of claim 1, wherein
at least one of the model information or the environmental information changes with passage of time.

3. The estimation system of claim 1, wherein
the human model includes a plurality of human models which are rendered in the virtual space, and
the one or more processors are configured to acquire the model information with respect to each of the plurality of human models.

4. The estimation system of claim 3, wherein
the environmental information includes, as a piece of information about the environment potentially having the particular effect on a first model, which is one of the plurality of human models, interaction information about at least one human model, other than the first model, out of the plurality of human models.

5. The estimation system of claim 1, wherein
the model information includes attribute information unique to the human model, and
the one or more processors are configured to adaptively change the condition estimated for the human model according to the attribute information.

6. The estimation system of claim 1, wherein
the environmental information includes information about an environment of a surrounding area set around the human model in the virtual space.

7. The estimation system of claim 6, wherein
the environmental information includes information about an environment caused by a factor generated from the human model.

8. The estimation system of claim 1, wherein
the environmental information includes information about at least one of temperature or lighting that potentially has an effect on the human model.

9. The estimation system of claim 1 wherein;
the one or more processors are further configured to determine a numerical number and/or arrangement of pieces of virtual equipment provided in the virtual space, the virtual equipment being configured to condition an environment represented by the environmental information.

10. A space design support system comprising:
the estimation system of claim 1; and
a display device,
the one or more processors being configured to display the presentation screen image on the display device.

11. The space design support system of claim 10, wherein
the virtual space is a space that simulates a real space, and
the one or more processors are configured to make the display device display the presentation screen image indicating the estimated condition of the human model in the virtual space.

12. An estimation method comprising:
acquiring model information about a human model rendered in a virtual space and generated based on model data of a human;
acquiring environmental information about an environment corresponding to the virtual space and potentially having a particular effect on the human model;
estimating a condition of the human model based on the model information and the environmental information, and
presenting, to a user, a result of an estimation made by the estimating, the presenting including:
  presenting the result of the estimation by displaying a presentation screen image indicating the result of the estimation and including the human model; and
  changing a mode of display of the human model in the presentation screen image depending on the result of the estimation, and
  the presentation screen image including an augmented reality area in which the human model is displayed to be superimposed on either a real space visible to an eye of the user or an image representing the real space.

13. A non-transitory computer-readable tangible recording medium storing a program designed to cause one or more processors to carry out the estimation method of claim 12.

* * * * *